(12) United States Patent
Huang et al.

(10) Patent No.: US 10,998,387 B2
(45) Date of Patent: May 4, 2021

(54) LIGHT EMITTING DEVICE

(71) Applicant: INT TECH CO., LTD., Hsinchu County (TW)

(72) Inventors: Li-Min Huang, Hsinchu County (TW); Yen-Chih Chiang, Hsinchu County (TW); Feng Yu Huang, Miaoli County (TW)

(73) Assignee: INT TECH CO., LTD., Hsinchu County (TW)

( * ) Notice: Subject to any disclaimer, the term of this patent is extended or adjusted under 35 U.S.C. 154(b) by 0 days.

(21) Appl. No.: 16/578,947

(22) Filed: Sep. 23, 2019

(65) Prior Publication Data

US 2020/0058714 A1 Feb. 20, 2020

Related U.S. Application Data

(63) Continuation-in-part of application No. 16/104,082, filed on Aug. 16, 2018, now Pat. No. 10,490,778.

(60) Provisional application No. 62/737,635, filed on Sep. 27, 2018.

(51) Int. Cl.
*H01L 27/32* (2006.01)
*H01L 51/52* (2006.01)

(52) U.S. Cl.
CPC ...... *H01L 27/3232* (2013.01); *H01L 51/5253* (2013.01); *H01L 51/5275* (2013.01); *H01L 51/5284* (2013.01); *H01L 27/322* (2013.01); *H01L 27/3211* (2013.01)

(58) Field of Classification Search
None
See application file for complete search history.

(56) References Cited

U.S. PATENT DOCUMENTS

| | | | |
|---|---|---|---|
| 9,484,555 B2 | 11/2016 | Choi et al. | |
| 2010/0148192 A1 | 6/2010 | Jung et al. | |
| 2012/0154422 A1* | 6/2012 | Ninan | G09G 3/025 345/589 |
| 2012/0281081 A1* | 11/2012 | Atif | G02B 27/0075 348/79 |

(Continued)

FOREIGN PATENT DOCUMENTS

| | | |
|---|---|---|
| CN | 104282718 A | 1/2015 |
| KR | 10-2008-0041954 | 5/2008 |

(Continued)

OTHER PUBLICATIONS

Office Action dated Nov. 29, 2019 issued by Taiwan Intellectual Property Office for counterpart application No. 107136782.

(Continued)

*Primary Examiner* — Michelle Mandala
(74) *Attorney, Agent, or Firm* — WPAT, P.C., Intellectual Property Attorneys; Anthony King

(57) ABSTRACT

A light emitting device includes a window and a collimating component over a light emitting pixel. A light reflection performance of the light emitting pixel to an incoming ambient light is configured by the window to be appeared to have at least two regions, wherein one region of the at least two regions has a smaller transmittance to the incoming ambient light than the other, the light emitting pixel includes a plurality of sub-pixels separated with a space, and the space is smaller than a resolution of a human eye.

17 Claims, 22 Drawing Sheets

(56) References Cited

U.S. PATENT DOCUMENTS

2015/0014655 A1    1/2015  Yun et al.
2017/0337863 A1   11/2017  Chang
2018/0097045 A1    4/2018  Maeda

FOREIGN PATENT DOCUMENTS

TW       201608319 A    3/2016
TW       201742242 A   12/2017

OTHER PUBLICATIONS

English Abstract Translation of Foreign Reference Document TW201608319A.
Office Action dated Jun. 10, 2020 issued by Taiwan Intellectual Property Office for counterpart application No. 108134283.
English Abstract Translation of the Office Action dated Jun. 10, 2020 issued by Taiwan Intellectual Property Office for counterpart application No. 108134283.
English Abstract Translation of Foreign Reference Document KR10-2008-0041954.
US20150014655 is the counterpart to CN104282718A.
US20170337863 is the counterpart to TW201742242A.

\* cited by examiner

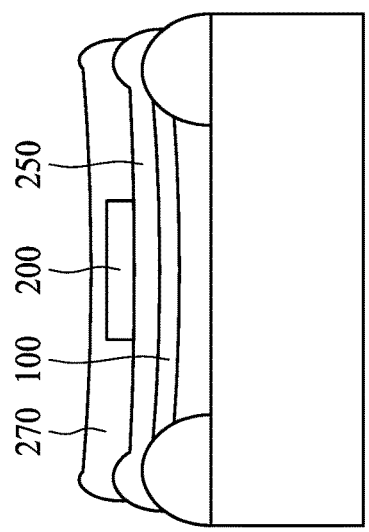
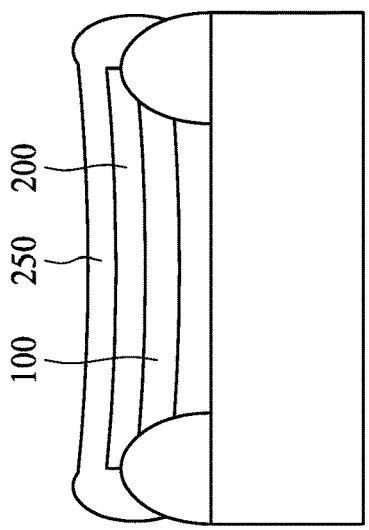
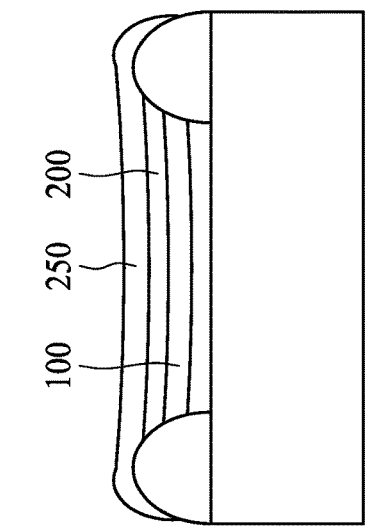
FIG. 6C
FIG. 6B
FIG. 6A

LIGHT EMITTING DEVICE

CROSS-REFERENCE TO RELATED APPLICATIONS

This application is a continuation-in-part application of a U.S. patent application entitled LIGHT EMITTING DEVICE, Ser. No. 16/104,082, filed Aug. 16, 2018, now allowed, and claims priority of U.S. provisional application Ser. No. 62/737,635 filed on Sep. 27, 2018. All of which are incorporated by reference in their entirety.

TECHNICAL FIELD

The present disclosure is related to light emitting device, especially to an organic light emitting device.

BACKGROUND

Organic light emitting display has been used widely in most high end electron devices. However, due to the constraint of current technology, the pixel definition is realized by coating a light emitting material on a substrate through a mask, and often, the critical dimension on the mask cannot be smaller than 100 microns.

SUMMARY

A light emitting device has a window over a light emitting pixel, wherein a light reflection performance of the light emitting pixel to an incoming ambient light is configured by the window to be appeared to have at least two regions, wherein one region of the at least two regions has a smaller transmittance to the incoming ambient light than the other.

In some embodiments, the window includes a photochromic material. In some embodiments, the window is a patterned film embedded in the light emitting device. In some embodiments, the window is in contact with the light emitting pixel. In some embodiments, the light emitting pixel is a single chrome pixel. In some embodiments, the light emitting pixel includes a plurality of sub-pixels separated with a space, and the space is smaller than a resolution of a human eye. In some embodiments, the light emitting device further includes a common electrode under the plurality of sub-pixels. In some embodiments, each subpixel is in contact with an electrode segment thereunder. In some embodiments, the electrode segment for each subpixel is respectively connected to a conductive plug. In some embodiments, the light emitting device further includes a black material surrounding the conductive plug. In some embodiments, the total areas between the plurality of sub-pixels are different.

A light emitting device includes a light emitting array having a plurality of light emitting pixels. The light emitting device also has an optical window over at least one of the plurality of light emitting pixels, wherein the optical window includes at least a first zone and a second zone, wherein the first zone is vertically aligned with a first region of the light emitting pixel and the second zone is vertically aligned with a second region of the light emitting pixel, wherein a transmittance to an incoming ambient light between the first zone and the second zone is different. In some embodiments, the optical window includes a photochromic material. In some embodiments, the first zone is further extended to have a total area greater than a total area of the first region. In some embodiments, the optical window includes at least one of a color filter, and a polarizer. In some embodiments, the optical window is surrounded by a dielectric layer. In some embodiments, the light emitting device further has an electrode between the optical window and the light emitting pixel. In some embodiments, the electrode is patterned to only cover the total area of a light emitting layer of the light emitting pixel. In some embodiments, the light emitting layer is organic.

BRIEF DESCRIPTION OF THE DRAWINGS

FIG. 6A is a cross sectional view illustrating another intermediate product of a light emitting device.
FIG. 6B is a cross sectional view illustrating another intermediate product of a light emitting device.
FIG. 6C is a cross sectional view illustrating another intermediate product of a light emitting device.

DETAILED DESCRIPTION OF THE DISCLOSURE

Figure 1:
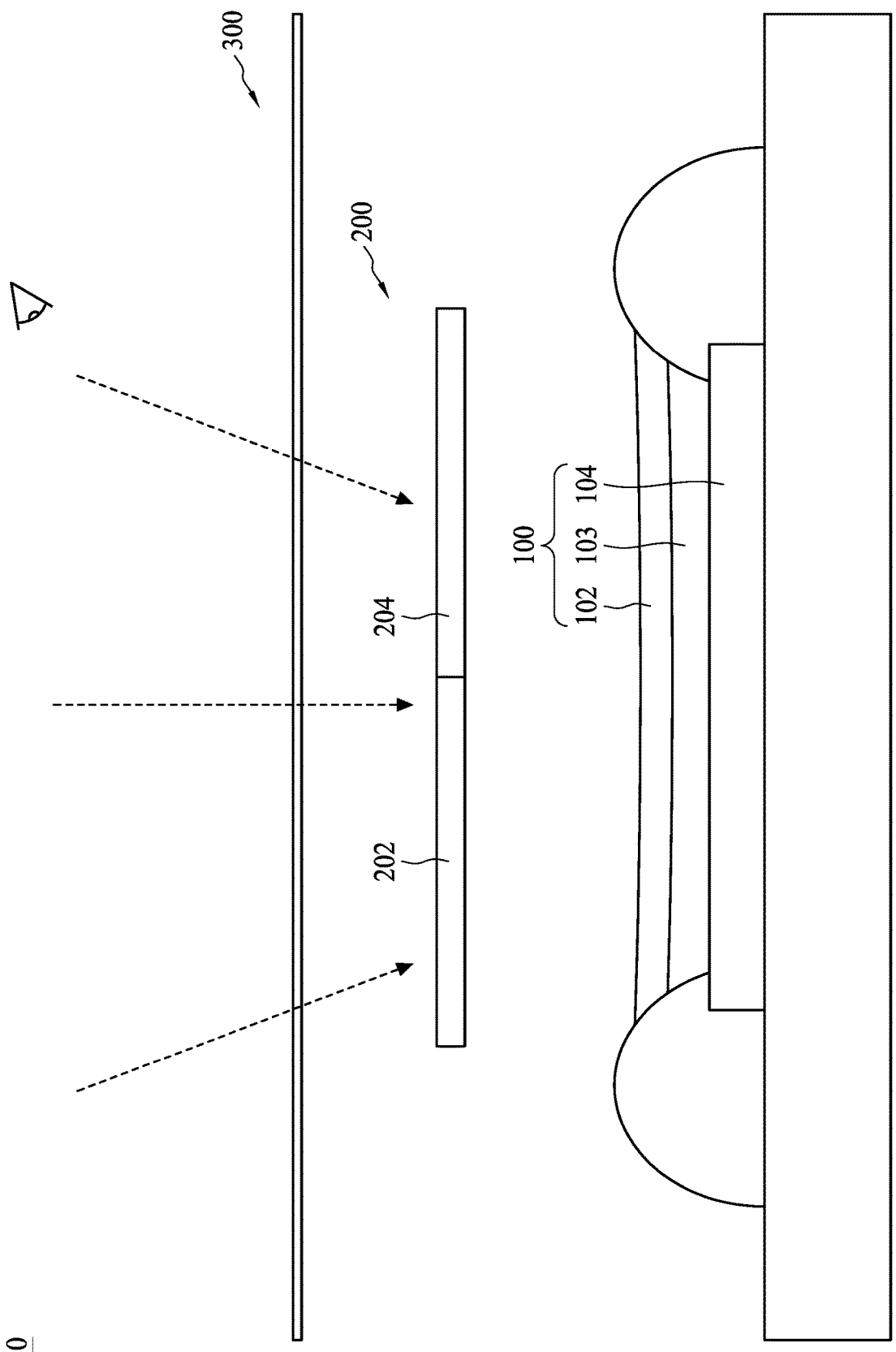
FIG. 1 is a cross sectional view illustrating an intermediate product of a light emitting device.

When a light emitting device is used, the contrast is dramatically affected by the ambient light. For example, if the light emitting device is used indoor under a mild ambient light, the light entering into the light emitting device may be relatively low compared to being used outdoor under sunlight. The light from outside and entering into the light emitting device is reflected by some embedded structures with high reflectivity such as electrode, metallic film, and the reflected ambient lights compete with the light emitting by the light emitting device itself. The contrast of the light emitting device is reduced and may be even blackened while viewed from the user if the device is operated under a strong sunlight.

Some arts adopt some solutions including incorporating optical material such as color filter, polarizer, or photochromic material inside the light emitting device to reduce the influence of the entering ambient light. In some cases, the optical material is applied on the areas that are not configured for receiving light emitting pixels, for example, PDL (pattern or pixel defined layer). The ambient lights entering the device are partially reduced, however, the light emitting pixels, which usually contribute most reflection due to the unavoidable high reflective electrode is encompassed. In some other cases, the optical material is globally applied on the areas without selection. The reflection from the high reflective embedded structures is effectively reduced but the light emitting efficiency of the light emitting device is also sacrificed without prejudice.

The present disclosure provides a solution to from a window for a corresponding light emitting pixel in a light emitting device. The window resides in the light emitting device and can be disposed on various locations in the device. The window has at least two zones and each zone has a different transmittance to ambient light from another. In some embodiments, the window includes an optical material. In some embodiments, the window is disposed on a predetermined location through which entered ambient light travels. In some embodiments, the window is defined as an area. In some embodiments, the window is disposed on a predetermined location where the light emitted from the light emitting pixel may travel through.

In the present disclosure, the term "a light emitting pixel" is defined as a light emitting unit configured to emit a monochrome light. In some embodiments, a light emitting pixel is a "single" light emitting pixel. In some embodiments, a light emitting pixel includes several sub-pixels arranged as a cluster in a range. The sub-pixels are designed to emit a same monochrome light but physically separated from each other at the light emitting layer. The range of the cluster may be under 50 um and the sub-pixels are deemed as one light emitting pixel when viewed with naked eye. However, the clustered sub-pixels may be distinguishable with aid of instruments such as optical microscope (OM). In the present disclosure, monochrome light can be referred as a light including several wavelengths but is convergent to perform one single color as viewed by the user with his/her eyes.

FIG. 1 is a simplified schematic of a light emitting device 10 including a representative light emitting pixel 100. The light emitting pixel 100 may be located in an array of light emitting pixels of the light emitting device 10. Lights from the ambient and enter into the light emitting device 10 are drawn as dotted arrows. A window 200 is disposed on a path where the ambient lights travel through. A cover 300 is optionally adopted to separate the structures inside the light emitting device 10 from the ambient. Lights from the ambient pass through the window 200 then enter into the light emitting device 10. In some embodiments, the window 200 is a film in-situ formed in the light emitting device 10. The light reflection performance of the light emitting pixel 100 to an incoming ambient light is configured by the window so as to be appeared to have at least two regions. One region has a smallest transmittance to the incoming ambient light in comparison to the other.

The light emitting pixel 100 includes a first electrode 102 and a second electrode 104. The light emitting pixel 100 also has a light emitting layer 103 between the first electrode 102 and the second electrode 104. In some embodiments, the light emitting layer 103 includes organic light emitting material. In some examples, the first electrode 102 includes a metallic material. In some examples, the second electrode 104 includes a metallic material, such as Cu, Al, Ag, Au, etc. In some examples, the second electrode 104 includes a transparent conductive material. In some embodiments, the first electrode 102 is cathode and the second electrode 104 is anode.

In the present embodiment, the window 200 is disposed above the light emitting pixel 100. The window 200 has a first zone 202 and a second zone 204. In some embodiments, the window 200 is formed by disposing a film over the light emitting pixel 100 and then use an operation to pattern the window 200 into different zones. In some embodiments, a photolithography or an etch operation is adopted to pattern the film into different zones. The film thickness for the first zone 202 and the second zone 204 can be different. In some embodiments, a portion of the film is removed to form the second zone 204 such that the second zone 204 is thinner than the first zone. In some embodiments, a film thickness of the second zone 204 is about zero.

Figure 2:
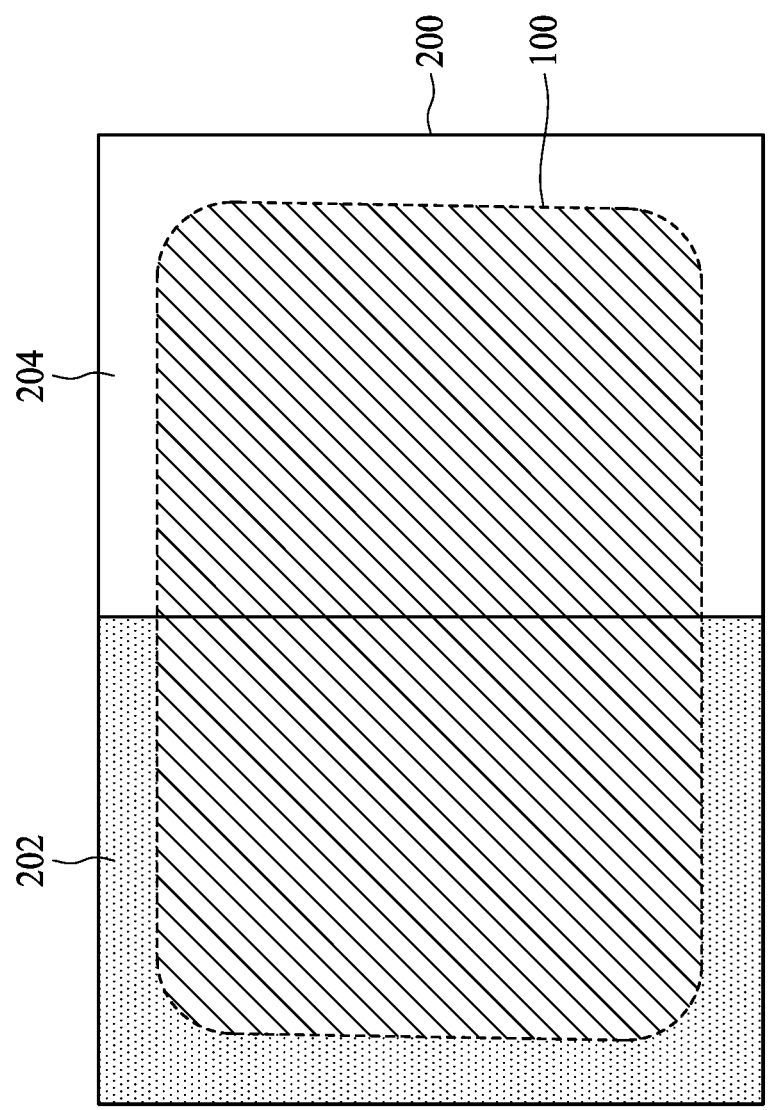
FIG. 2 is a top view corresponding to FIG. 1.

One distinguishable characteristic between the first zone 202 and a second zone 204 is the optical response to the entered ambient lights. The first zone 202 is configured to have a lower transmittance to the entered ambient lights than that of the second zone 204. From a top view perspective, the optical performance of the light emitting pixel 100 is divided into two portions as shown in FIG. 2. The light emitting area of the pixel 100 is covered by the first zone 202 and the optical performance of the covered area is affected by the first zone 202. Similarly, the light emitting area of the pixel 100 is under second zone 204 and the optical performance of the covered area is affected by the second zone 204.

For example, if the first zone 202 includes an optical filter for the predetermined wavelength spectrum with absorption rate around 70% and the second zone 204 is configured as substantially transparent to the visible light. When the light emitting device 10 is operated outdoor, lights enter into the light emitting device 10 may hit the window 200 before reaching the pixel 100. The lights pass through the first zone 202 are absorbed substantially and only lights with the predetermined wavelength spectrum that are allowed to pass the first zone 202, therefore, the reflection from the pixel area covered by the first zone 202 is much lower than the pixel area covered by the second zone 204. Though the reflection from the second zone 204 covered side is unchanged, the total reflection of the pixel 100 is reduced through implementing the window 200. While most light emitting pixels is covered by a window 200, the anti-reflection and contrast of the light emitting device 10 can be improved. In some embodiments, the first zone 202 includes a color filter configured to be corresponding to the light emitting pixel 100. For example, the light emitting pixel 100 is a red color pixel and the first zone 202 includes a red color filter.

In some embodiments, the first zone 202 includes a photochromic material. The photochromic material is colorless in a dark place, and when sunlight or ultraviolet radiation is applied the molecular structure of the photochromic material changes and it exhibits color. When the relevant light source is removed the color disappears. If light emitting device 10 is operated under sunlight, a portion of the entering sunbeams is blocked by the first zone 202 before reaching the pixel 100. Therefore, the reflection from the pixel 100 can be reduced. In some embodiments, the first zone includes a polarizer.

Figure 3:
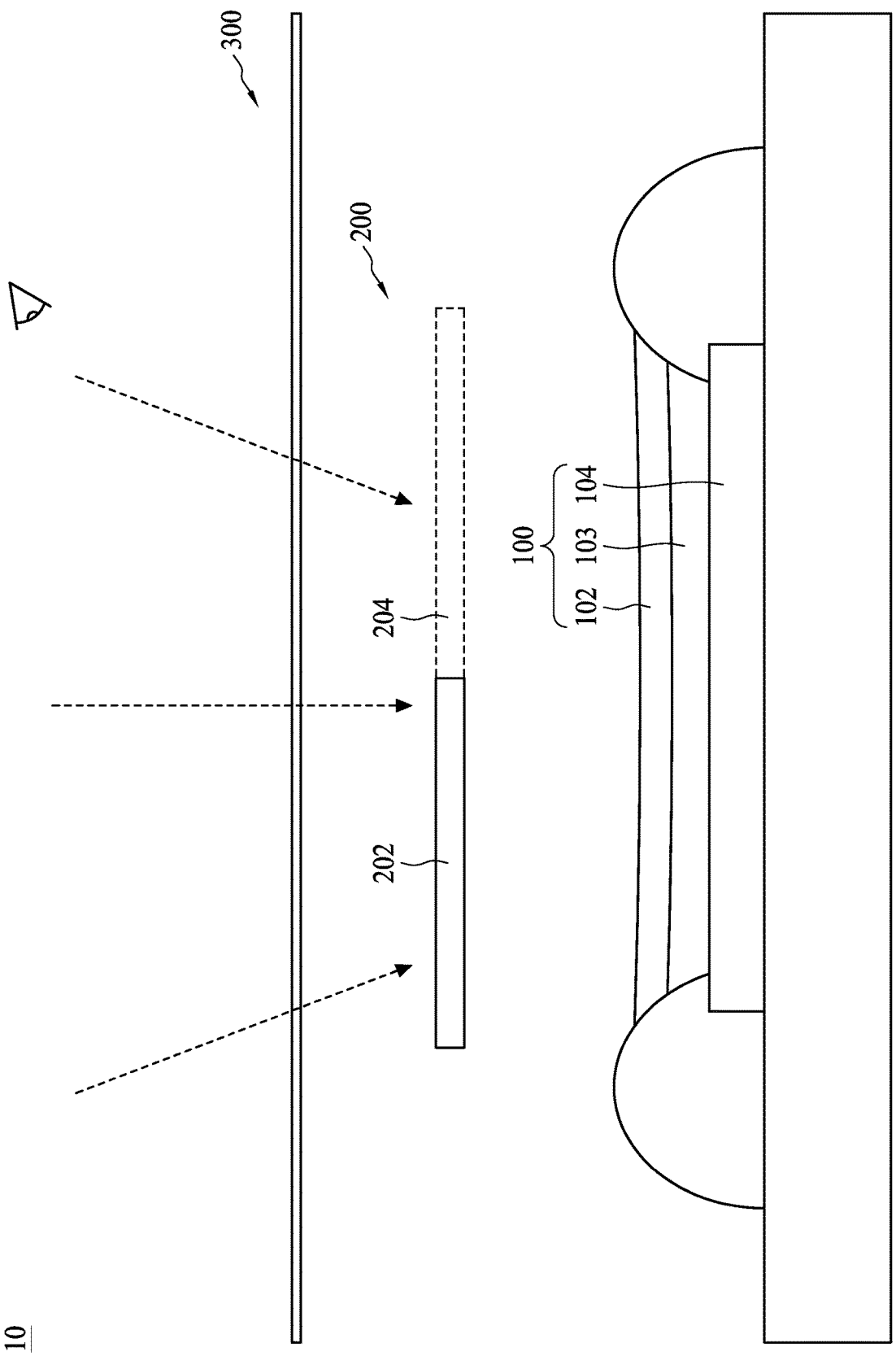
FIG. 3 is a cross sectional view illustrating another intermediate product of a light emitting device.
Figure 4:
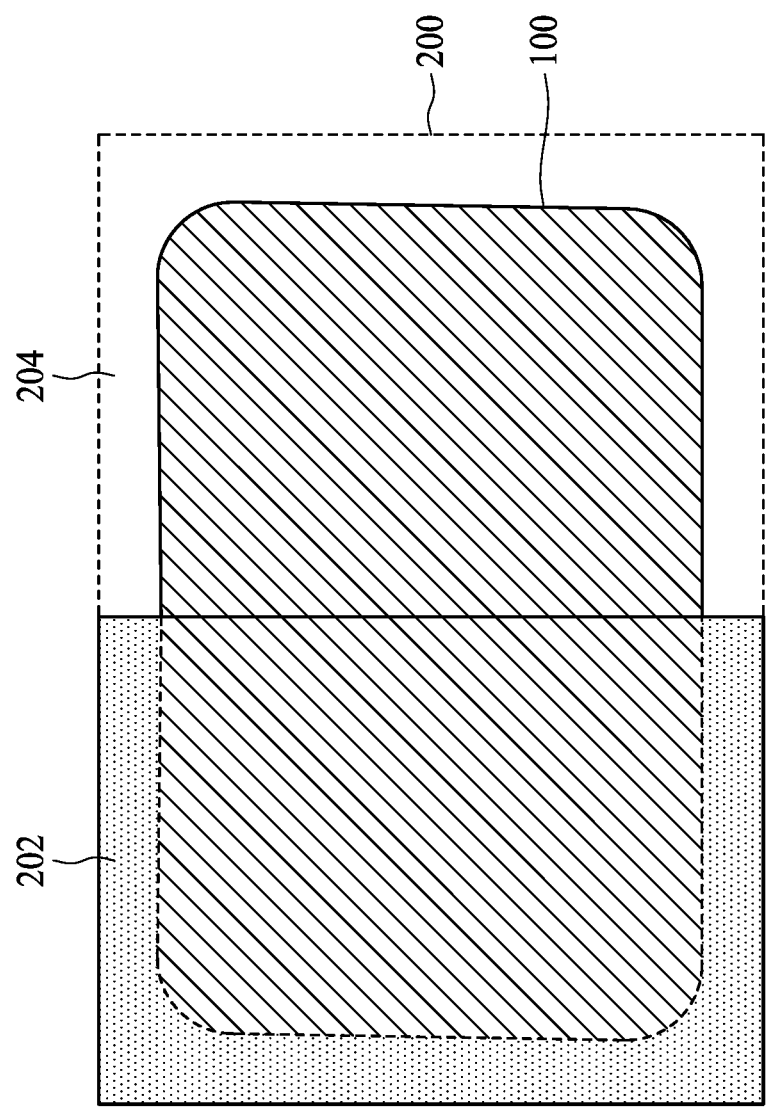
FIG. 4 is a top view corresponding to FIG. 3.
Figure 5:
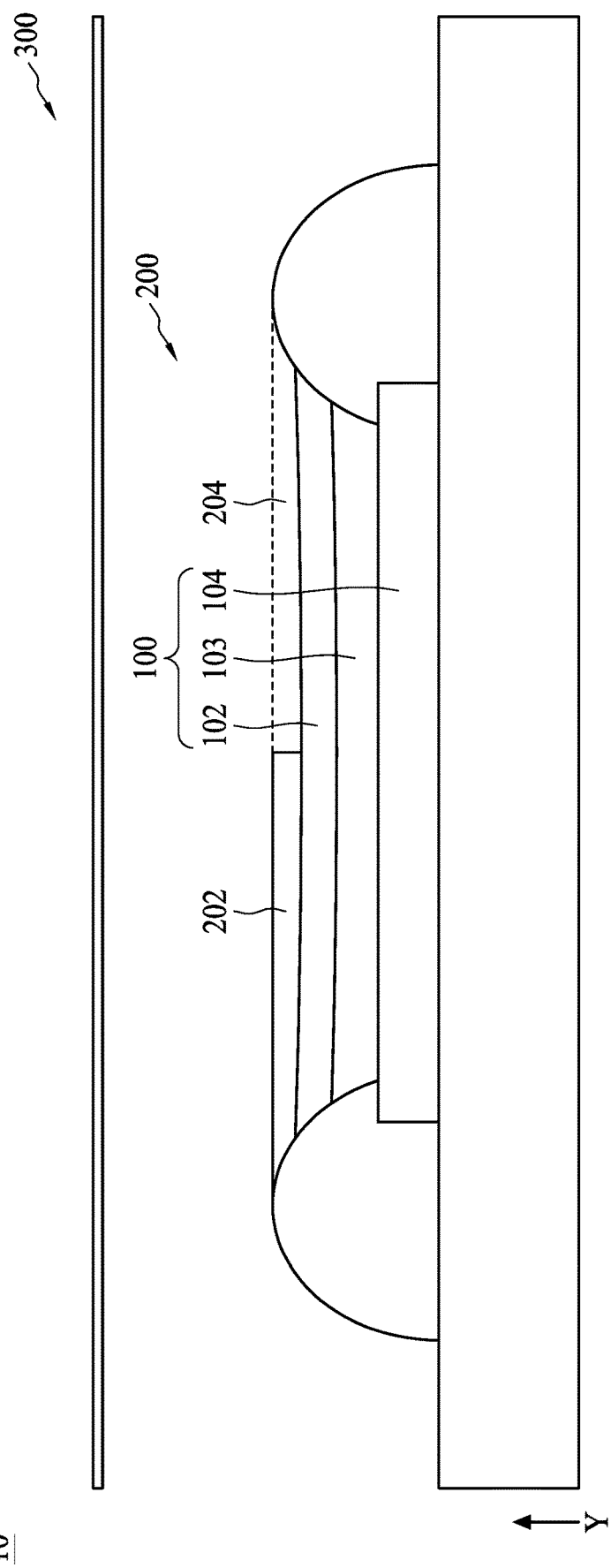
FIG. 5 is a cross sectional view illustrating another intermediate product of a light emitting device.

In some embodiments, the second zone 204 is a blank region of the window 200 as shown in FIG. 3. The second zone 204 is drawn in dotted line to indicate that there is no physical material existed from a cross-sectional view. The first zone 202 has a total area being smaller than the total light emitting area of the pixel 100. The light emitting pixel 100 is partially regulated by the first zone 202. FIG. 4 is a top view of FIG. 3 and showing that a portion of the light emitting pixel 100 is exposed from the virtual second zone 204.

In some embodiments, the window 200 is in contact with the first electrode 102 of the light emitting pixel 100. In some embodiments, the window 200 is over the first electrode 102 of the light emitting pixel 100 and a dielectric is between the window 200 and the first electrode 102 along the vertical direction. In some embodiments, an encapsulation material including oxide, or nitride is between the window 200 and the first electrode 102 along the vertical direction. In some embodiments, a polymeric material is between the window 200 and the first electrode 102 along the vertical direction. The vertical direction used herein is the direction along which light emitting pixel 100 and window 200 stacks.

In FIG. 6A, the window 200 is in contact with the light emitting pixel 100. The window 200 is also between a dielectric 250 and the light emitting pixel 100. In some cases, the window 200 is in contact with the light emitting pixel 100 at a first side and in contact with the dielectric 250 at the other side which is opposite to the first side.

In FIG. 6B, the window 200 is above the light emitting pixel 100 but surrounded by a dielectric 250. In some embodiments, the window 200 is in contact with the light emitting pixel 100 at a first side and in contact with the dielectric 250 at the other side which is opposite to the first side. In some embodiments, the window 200 is totally surrounded by the dielectric 250 without any contact with the light emitting pixel 100.

In FIG. 6C, the window 200 is above the light emitting pixel 100 but surrounded by a layer 270. In some embodiments, the layer 270 is another dielectric different from dielectric 250. In some embodiments, the layer 270 includes oxide. In some embodiments, the layer 270 is configured as a cover layer of the light emitting device. In some embodiments, the layer 270 includes polymeric material.

In some embodiments, the window 200 is in contact with the dielectric 250 at a first side and in contact with the layer 270 at the other side which is opposite to the first side. In some embodiments, the window 200 is totally surrounded by the layer 270 without any contact with the dielectric 250.

Figure 7:
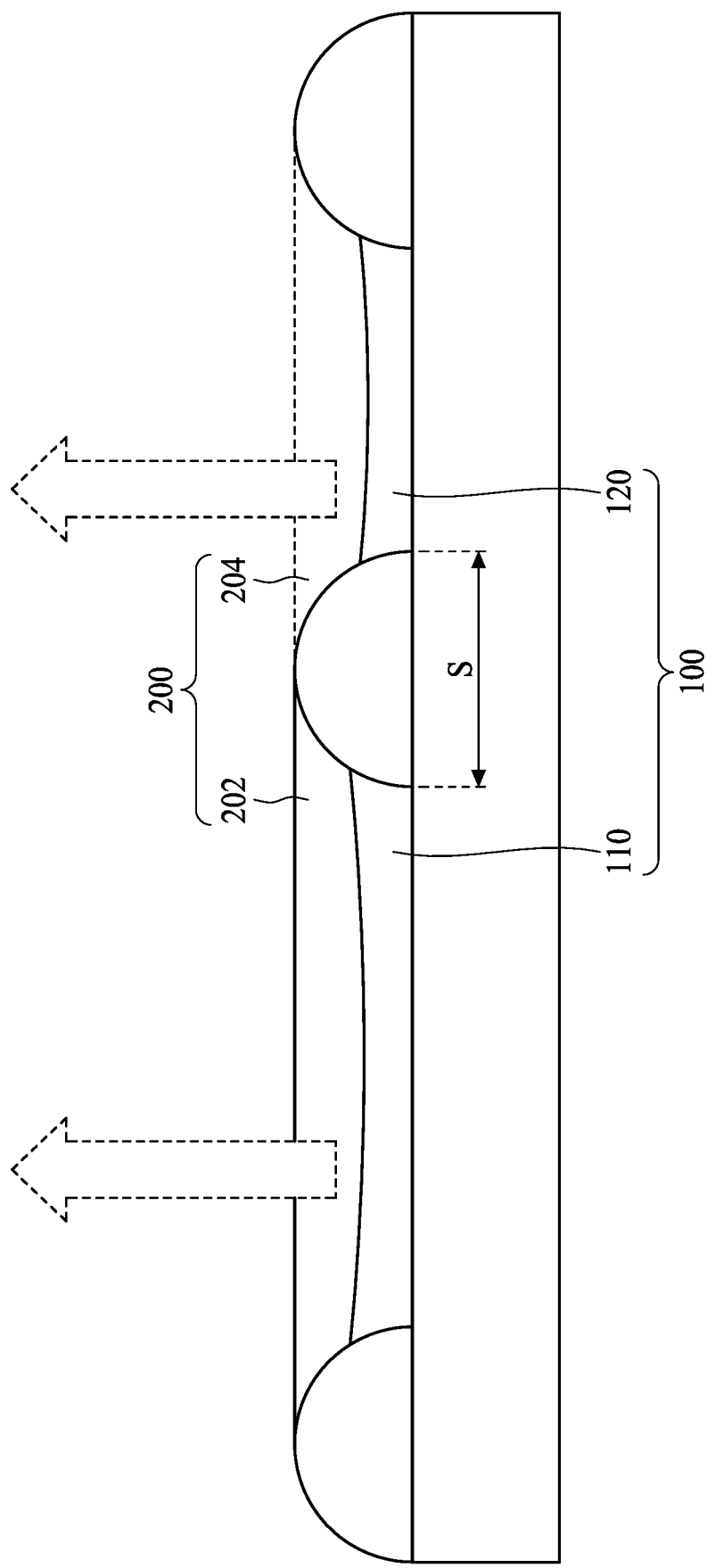
FIG. 7 is a cross sectional view illustrating another intermediate product of a light emitting device.

In some embodiments, a light emitting pixel may include several subpixels as shown in FIG. 7. The light emitting pixel 100 has at least two subpixels 110 and 120. Subpixel 110 and subpixel 120 are respectively configured to emit a light with a same wavelength spectrum. In some embodiments, the carrier transportation layers and carrier injection layers of subpixels 110 and 120 are the same. In some embodiments, the horizontal spacing S between subpixels 110 and 120 is smaller enough and is not distinguishable by a naked eye of the viewer. Therefore, from the user's point of view, subpixels 110 and 120 act as a "single" monochrome light emitting pixel.

In some embodiments, the spacing S is less than about 50 um. In some embodiments, the spacing S is less than about 30 um. In some embodiments, the spacing S is less than about 20 um. In some embodiments, the spacing S is less than about 10 um. In some embodiments, the spacing S is less than about 8 um. In some embodiments, the spacing S is less than about 5 um. In some embodiments, the spacing S is 0. In some embodiments, the spacing is smaller than a resolution of a human eye viewing from a 25 cm distance.

The window 200 used in the multi-subpixel configuration is similar to the window 200 used in the embodiments as illustrated in FIGS. 1-6. The optical window 200 herein also has two zones. A first zone 202 is substantially vertically aligned with subpixel 110, and a second zone 204 is substantially vertically aligned with subpixel 120. The transmittance of the first zone 202 is different from the second zone 204. In some embodiments, the light reflection from subpixel 110 is much lower than the light reflection from subpixel 120 because the first zone 202 includes at least a filter, polarizer, photochromic material, or other optical materials.

Though the reflection of incoming ambient light from subpixel 110 is reduced by the first zone 202 of window 200, the luminous intensity emitted to the viewer from subpixel 110 may be reduced as well. For the second zone 204, more ambient light may enter and be reflected by the subpixel 120 than subpixel 110, however, the luminous intensity drop for subpixel 120 is much less than that for subpixel 110.

In multi-subpixel configuration, the reflection and luminous intensity of each light emitting pixel can be adjusted to a preferred mode for each user. In the present disclosure, there are several ways to balance the reflection and luminous intensity for each pixel.

Figure 8:
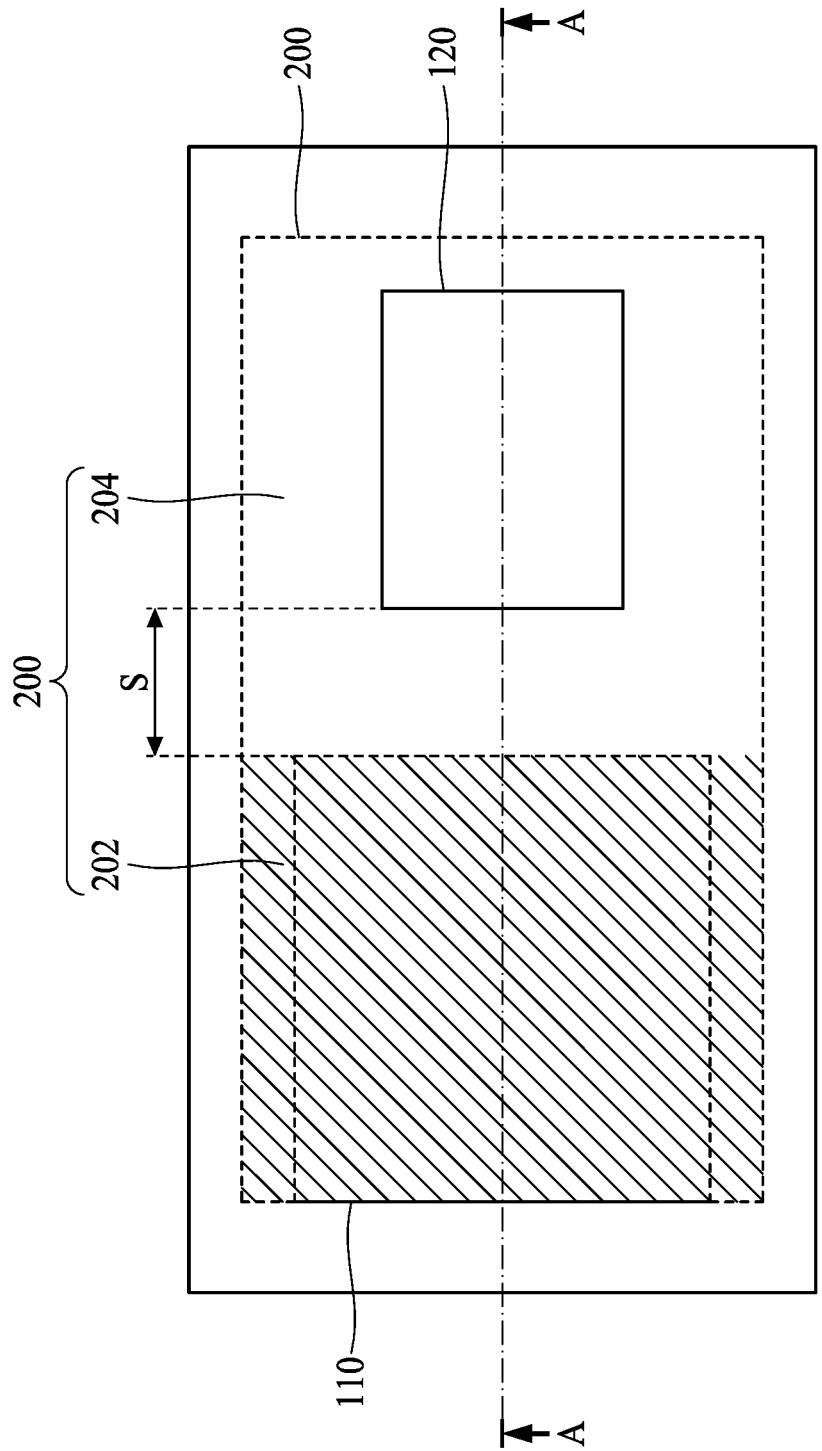
FIG. 8 is a top view corresponding to FIG. 7.

In some embodiments, a total effective light emitting area of subpixel 110 is different to a total effective light emitting area of subpixel 120. FIG. 8 is the top view of the FIG. 7, and FIG. 7 is the cross-sectional view along line AA in FIG. 8. From the top view, the first zone 202 of the window 200 is disposed substantially over subpixel 110 and the second zone 204 is disposed substantially over subpixel 120. The total effective light emitting area of each subpixel is illustrated as solid rectangular box. In some embodiments, the total effective light emitting area of a subpixel is the total area that the first electrode 102 overlays on light emitting layer 103 as shown in FIG. 1. In some embodiments, the total effective light emitting area of subpixel 110 is greater than the total effective light emitting area of subpixel 120.

In some embodiments, the total effective light emitting area of subpixel 110 is greater than the total effective light emitting area of subpixel 120. In some embodiments, the total effective light emitting area of subpixel 110 is about 2 times greater than the total effective light emitting area of subpixel 120. In some embodiments, the total effective light emitting area of subpixel 110 is about 4 times greater than the total effective light emitting area of subpixel 120. In some embodiments, the total effective light emitting area of subpixel 110 is about 6 times greater than the total effective light emitting area of subpixel 120.

Figure 9:
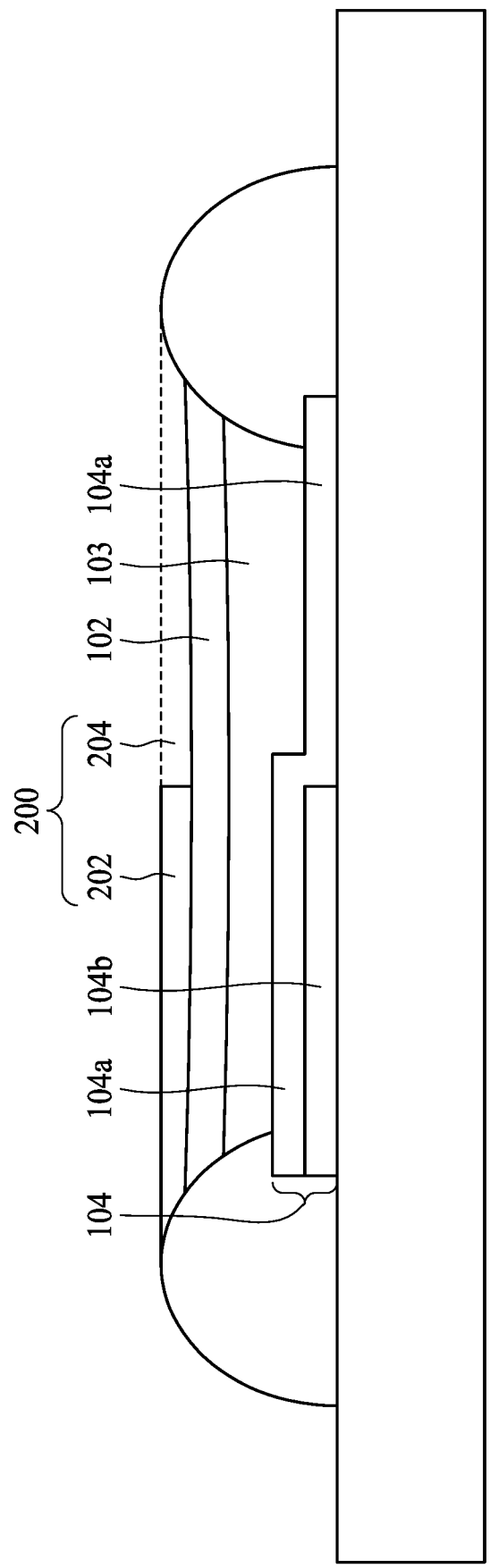
FIG. 9 is a cross sectional view illustrating another intermediate product of a light emitting device.
Figure 10:
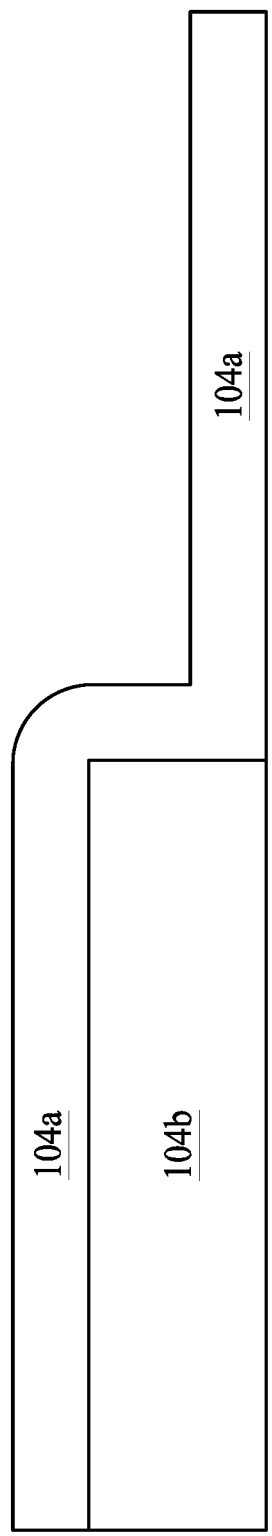
FIG. 10 is an enlarged view of a portion in FIG. 9.

The second electrode of the light emitting pixel can be configured into various types in accordance to the design requirement for the window 200. As shown in FIG. 9, the second electrode 104 has a non-uniform thickness. In the region that is vertically aligned with the first zone 202, the second electrode is configured to have at least two layers stacking vertically. A layer 104a is stacked on a layer 104b. In some embodiments, the layer 104a includes a transparent conductive material such as ITO, IZO, etc., and the layer 104b is a metallic conductive film. In some embodiments, for a visible light, the transmittance of the layer 104a is higher than that of the layer 104b. In some embodiments, the sheet resistance of the layer 104a is higher than that of the layer 104b. In the region that is vertically aligned with the second zone 204, the second electrode is configured to have one layer, layer 104a. In some embodiments, the layer 104a is a transparent conductive material. In some embodiments, the effective sheet resistance of the second electrode 104 measured along the horizontal direction can be substantially divided into a higher resistance portion, which is vertically aligned with the second zone 204 of window 200, and a lower resistance portion, which is vertically aligned with the first zone 202 of window 200. FIG. 10 is an enlarged view of the second electrode 104 in FIG. 9. The layer 104b is continuously extended along the horizontal direction and conformally disposed over the layer 104a. A portion of the layer 104b has a bottom surface being coplanar with a bottom surface of the layer 104a.

Figure 11:
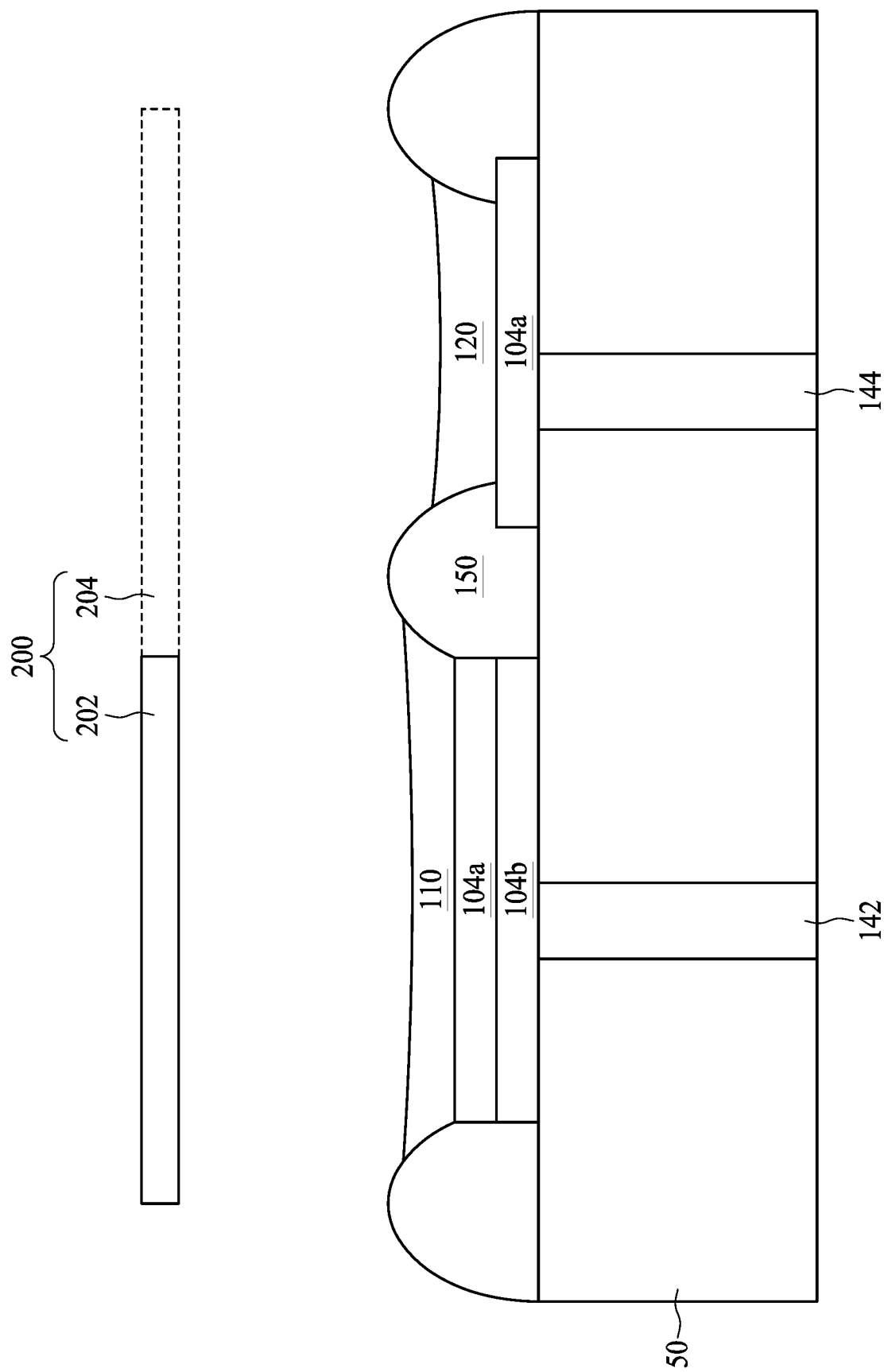
FIG. 11 is a cross sectional view illustrating another intermediate product of a light emitting device.

In the embodiments having multi-subpixel configuration, the second electrode 104 for each subpixel can be separated into several segments as illustrated in FIG. 11. The segments are separated by a polymeric material 150. In some embodiments, the polymeric material 150 is configured as a pixel/subpixel defined layer (PDL). In some embodiments, the polymeric material 150 is photosensitive. In some embodiments, the polymeric material 150 includes black material (BM). Different segments may have different total area. In some embodiments, the total area of each segment is in proportional to the total effective light emitting area of the corresponding subpixel. In some embodiments, a total area of each segment is greater than the total effective light emitting area of the corresponding subpixel.

In some embodiments, one segment of the second electrode 104 is disposed under the light emitting subpixel 110, and the segment under subpixel 110 has a transparent conductive layer 104a and a metallic conductive layer 104b. The first zone 202 of window 200 is disposed substantially align with the subpixel 110 and the electrode segment 104a/b. Light entering into the light emitting device may pass layer 104a but is reflected by layer 104b. However, the reflected light is reduced by the first zone 202 before entering into viewer's eyes. Another segment of the second electrode 104 is disposed under the light emitting subpixel 120. The electrode segment under subpixel 120 only has a transparent conductive layer 104a and no high reflective layer 104b. In some embodiments, since the reflection from the subpixel 120 side is relative low in comparison with the subpixel 110 side, the second zone 204 can includes a high transmittance material. In some embodiments, the second zone 204 can be physically removed from the window 200.

In some embodiments, each electrode segment is connected to a conductive plug. The electrode segment for subpixel 110 is in contact with a conductive plug 142, and the electrode segment for subpixel 120 is in contact with a conductive plug 144. In some embodiments, the conductive plug 142 and conductive plug 144 are electrically connected. In some embodiments, the conductive plug 142 and conductive plug 144 are designed to be equal potential.

The conductive plugs are disposed in a dielectric material 50. The dielectric material 50 is under the second electrode 104 and subpixels. In some embodiments, the dielectric material 50 includes a light absorption material, which absorbs the lights entering into the device. In some embodiments, the dielectric material 50 includes black material (BM). In some embodiments, the dielectric material 50 is configured to be a planarization layer for a thin film transistor (TFT) array. The TFT array (not shown in the drawings) is under the material 50. In some embodiments, the dielectric material 50 is between an interconnect of the thin film transistor (TFT) array and the second electrode 104. In some embodiments, the dielectric material 50 is between a interconnect capacitor and the second electrode 104.

Figure 12:
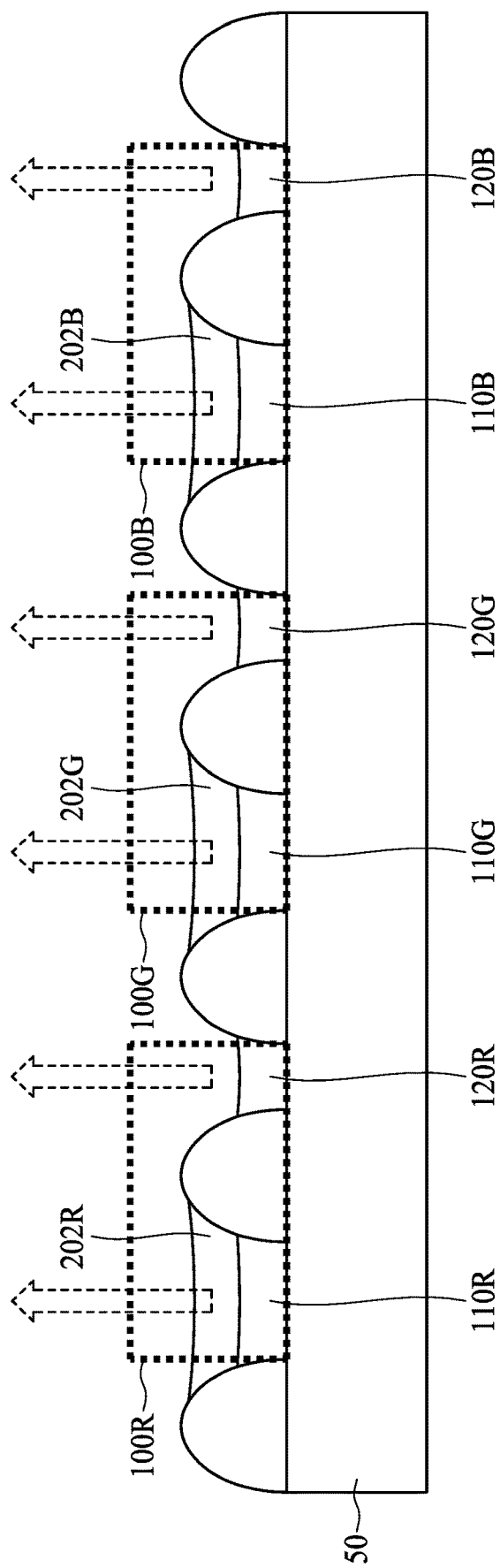
FIG. 12 is a cross sectional view illustrating another intermediate product of a light emitting device.

FIG. 12 illustrated an RGB light emitting unit in a light emitting device. There are three light emitting pixels and each light emitting pixel has at least two subpixels. The red pixel 100R has a subpixel 110R and a subpixel 120R. The red pixel 100G has a subpixel 110G and a subpixel 120G. The red pixel 100B has a subpixel 110B and a subpixel 120B. Optionally, each pixel has an optical window deposed thereon. Optical window zone 202R is vertically aligned with subpixel 110R to reduce the reflection from the electrode under subpixel 110R. Optical window zone 202G is vertically aligned with subpixel 110R to reduce the reflection from the electrode under subpixel 110G. Optical window zone 202B is vertically aligned with subpixel 110R to reduce the reflection from the electrode under subpixel 110B.

Figure 13:
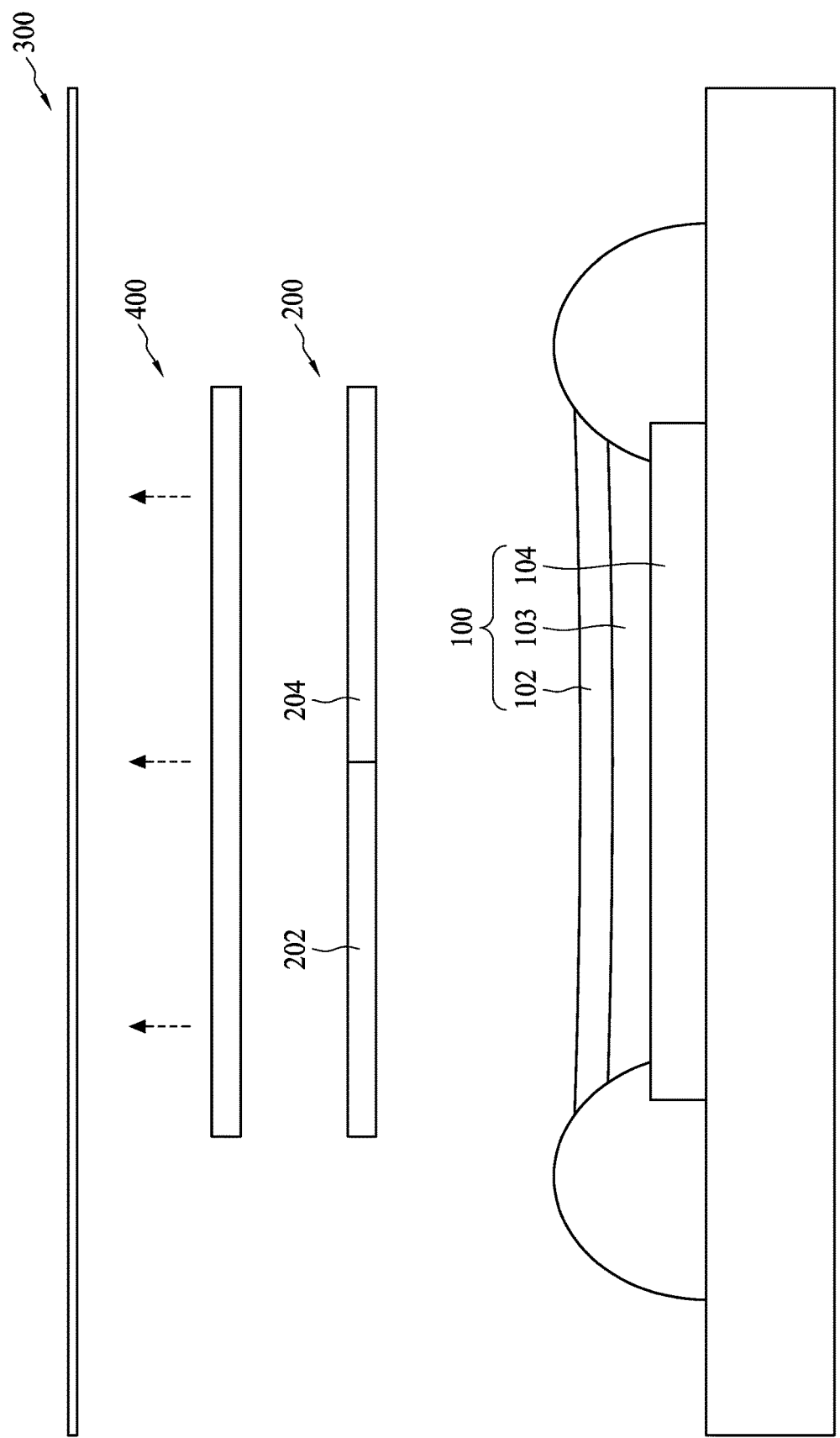
FIG. 13 is a cross sectional view illustrating another intermediate product of a light emitting device.

FIG. 13 is a cross sectional view illustrating another intermediate product of a light emitting device. The light emitting device 10 may further include a collimating component 400. The collimating component 400 is disposed on a path where the lights emitted from the light emitting pixel 100 may travel through. The collimating component 400 is used to collimate wide divergent light from the light emitting pixel 100 into a small cone angle light. Lights from the light emitting pixel 100 pass through the collimating component 400 then enter the ambient. The collimating component 400 may assist the direction of the lights to become more aligned in a specific direction. After the lights from the light emitting pixel 100 pass through the collimating component 400, the lights become collimated lights such that the lights will spread minimally as they propagates.

As shown in FIG. 13, the collimating component 400 may be disposed above the light emitting pixel 100 and is disposed over the window 200. The collimating component 400 may be disposed vertically aligned with the window 200. Lights from the light emitting pixel 100 pass through the window 200 then enter the collimating component 400. After the lights from the light emitting pixel 100 pass through the collimating component 400, the lights become collimated lights. The collimating component 400 may partially or entirely overlap the window 200.

Figure 14:
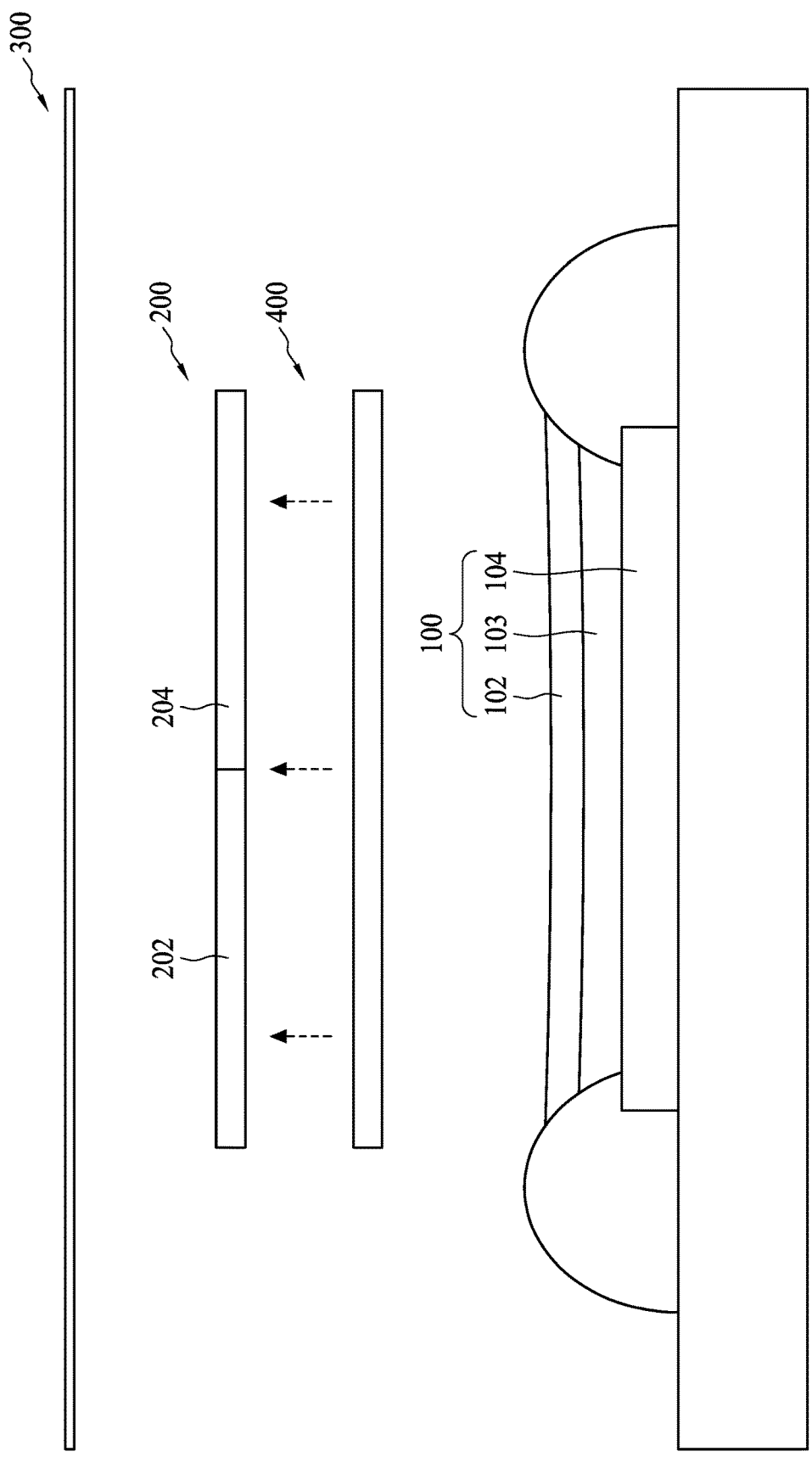
FIG. 14 is a cross sectional view illustrating another intermediate product of a light emitting device.

FIG. 14 is a cross sectional view illustrating another intermediate product of a light emitting device. As shown in FIG. 14, the collimating component 400 may be disposed above the light emitting pixel 100 and is disposed under the window 200. The collimating component 400 may be disposed vertically aligned with the window 200. Lights from the light emitting pixel 100 pass through the collimating component 400 then enter the window 200. Thus, collimated lights enter the window 200. The collimating component 400 may partially or entirely overlap the window 200.

Figure 15:
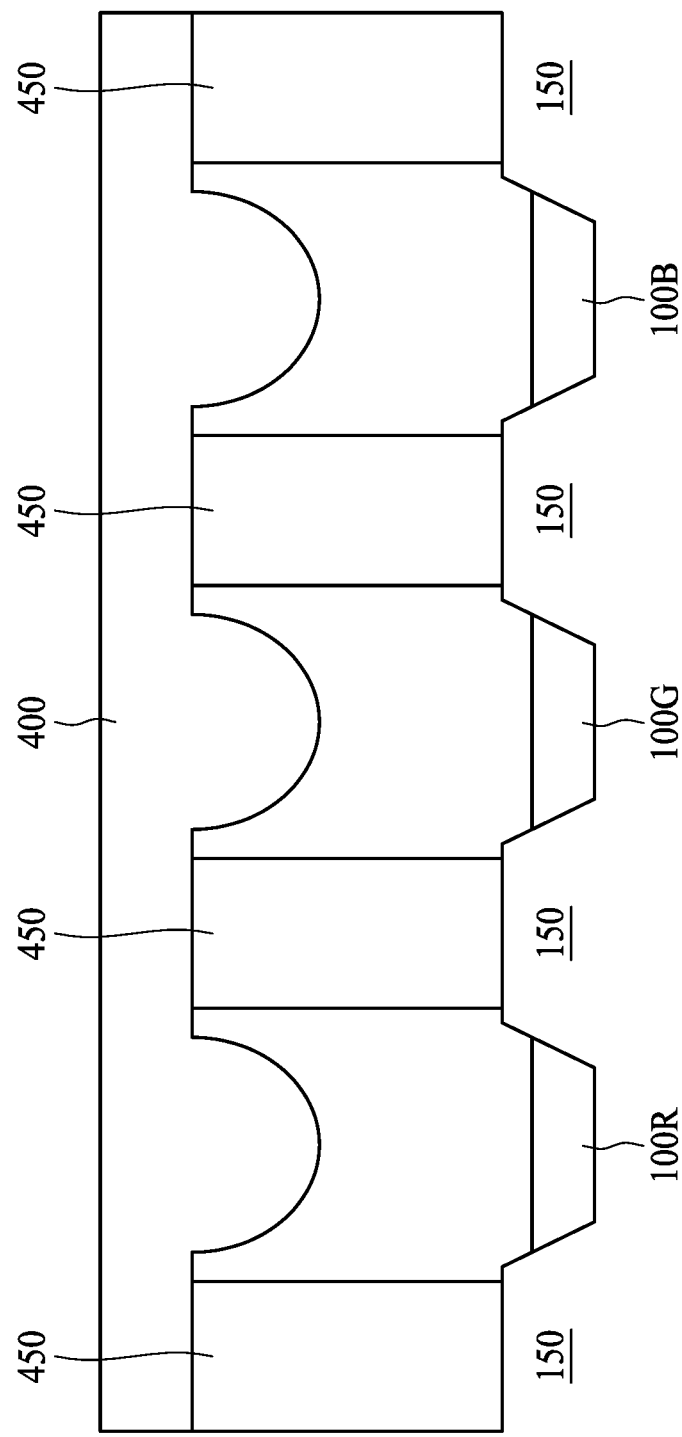
FIG. 15 is a cross sectional view illustrating another intermediate product of a light emitting device.

The collimating component 400 may include a patterned optical film, an optical collimating lens, optical fibers or a combination thereof. As shown in FIG. 15, the collimating component 400 may include an optical collimating lens and disposed over the light emitting pixel 100. The distance between the collimating component 400 and the light emitting pixel 100 may be arranged similar or equal to the focal length of the collimating component 400 such that the light emitting pixel 100 is at the focus of the collimating component 400. Thus, a beam of collimated light will be generated. In some embodiment, the light emitting device 10 may further include a black material 450 between neighboring pixel or subpixel, and adjacent to the collimating component 400.

Figure 16:
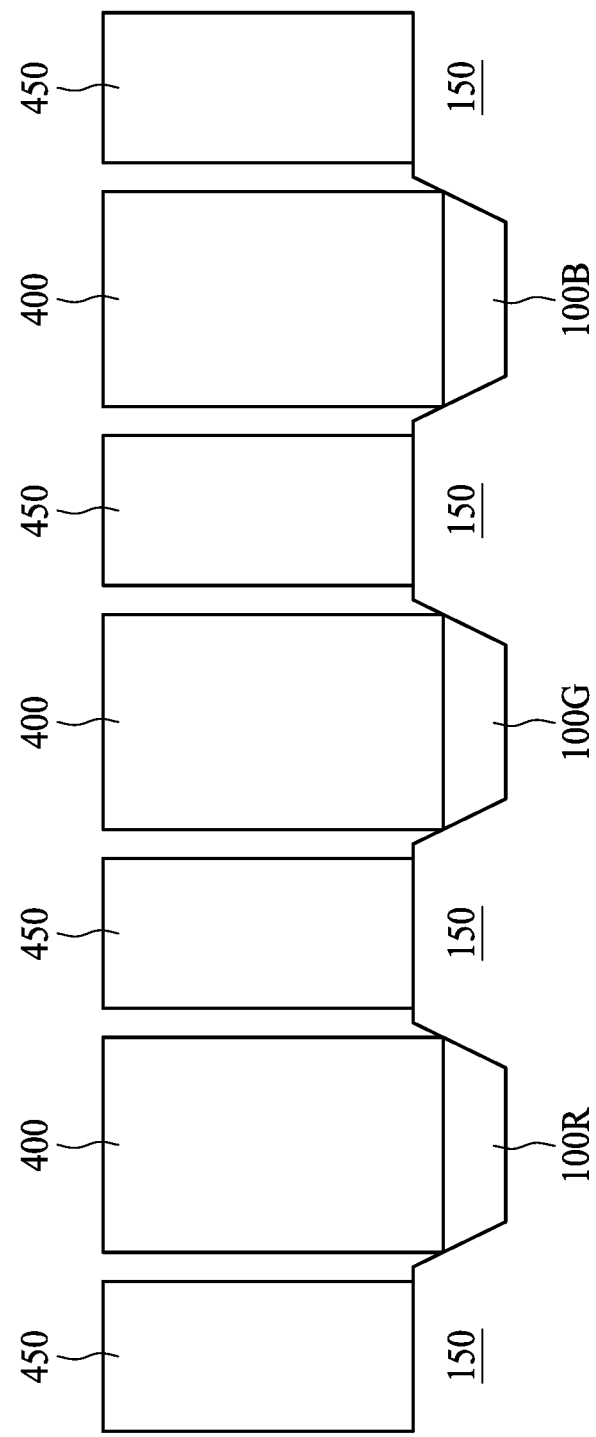
FIG. 16 is a cross sectional view illustrating another intermediate product of a light emitting device.

As shown in FIG. 16, the collimating component 400 may include a patterned optical film and disposed over the light emitting pixel 100. The collimating component 400 may be formed by disposing a film over the light emitting pixel 100. The collimating component 400 may include high refractive index materials compared to a reference medium. For instance, a refractive index of the collimating component 400 may be higher than the refractive index of vacuum or air. Refraction is generally accompanied by partial reflection. When a light is refracted from a medium of higher refractive index to a medium of lower refractive index, the angle of refraction is greater than the angle of incidence. As the angle of incidence increases beyond the critical angle, the partial reflection becomes total. Accordingly, lights from the light emitting pixel 100 passing through the collimating component 400 may be reflected in the collimating component 400. Thus, a beam of collimated light may be generated.

Figure 17:
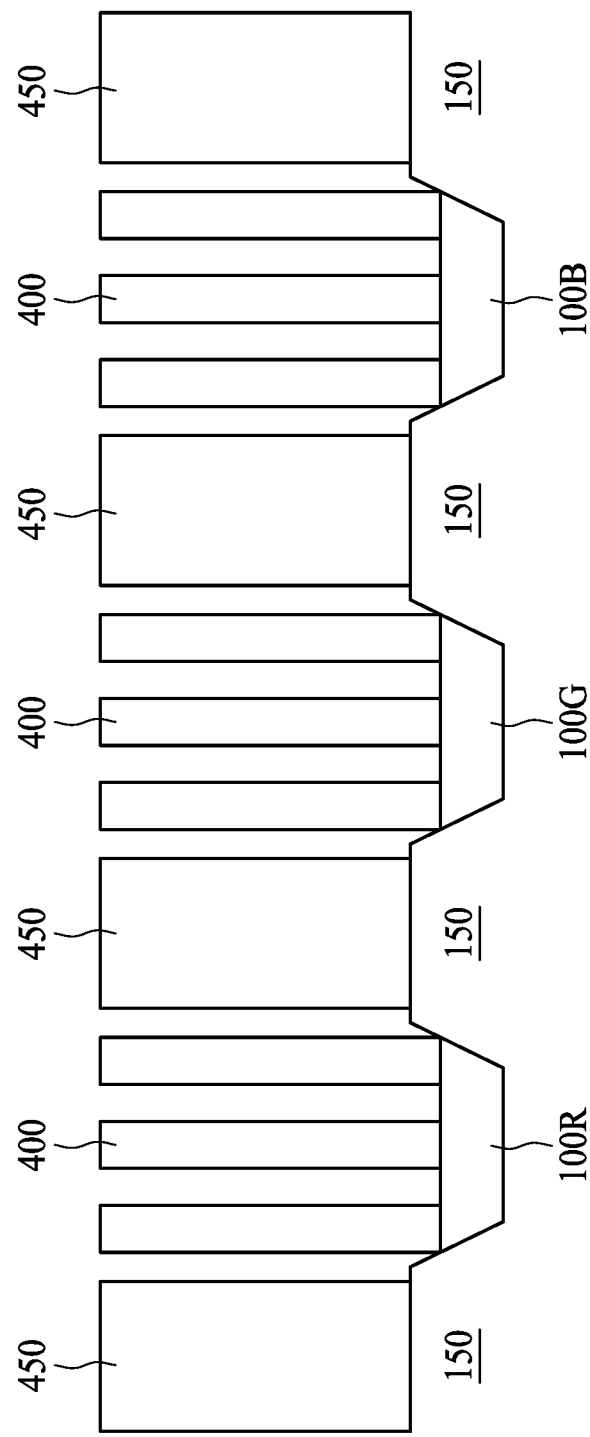
FIG. 17 is a cross sectional view illustrating another intermediate product of a light emitting device.

As shown in FIG. 17, the collimating component 400 may include optical fibers and disposed over the light emitting pixel 100. The collimating component 400 may be in contact with the light emitting pixel 100, but not limited thereto. Lights from the light emitting pixel 100 transmit between the two ends of the collimating component 400. The collimating component 400 may act as a waveguide and the lights may be kept in the core by the phenomenon of total internal reflection. Hence, the lights emitted from the light emitting pixel 100 become collimated lights. In some embodiments, the black material 450 may laterally surround the collimating component 400.

Figure 18:
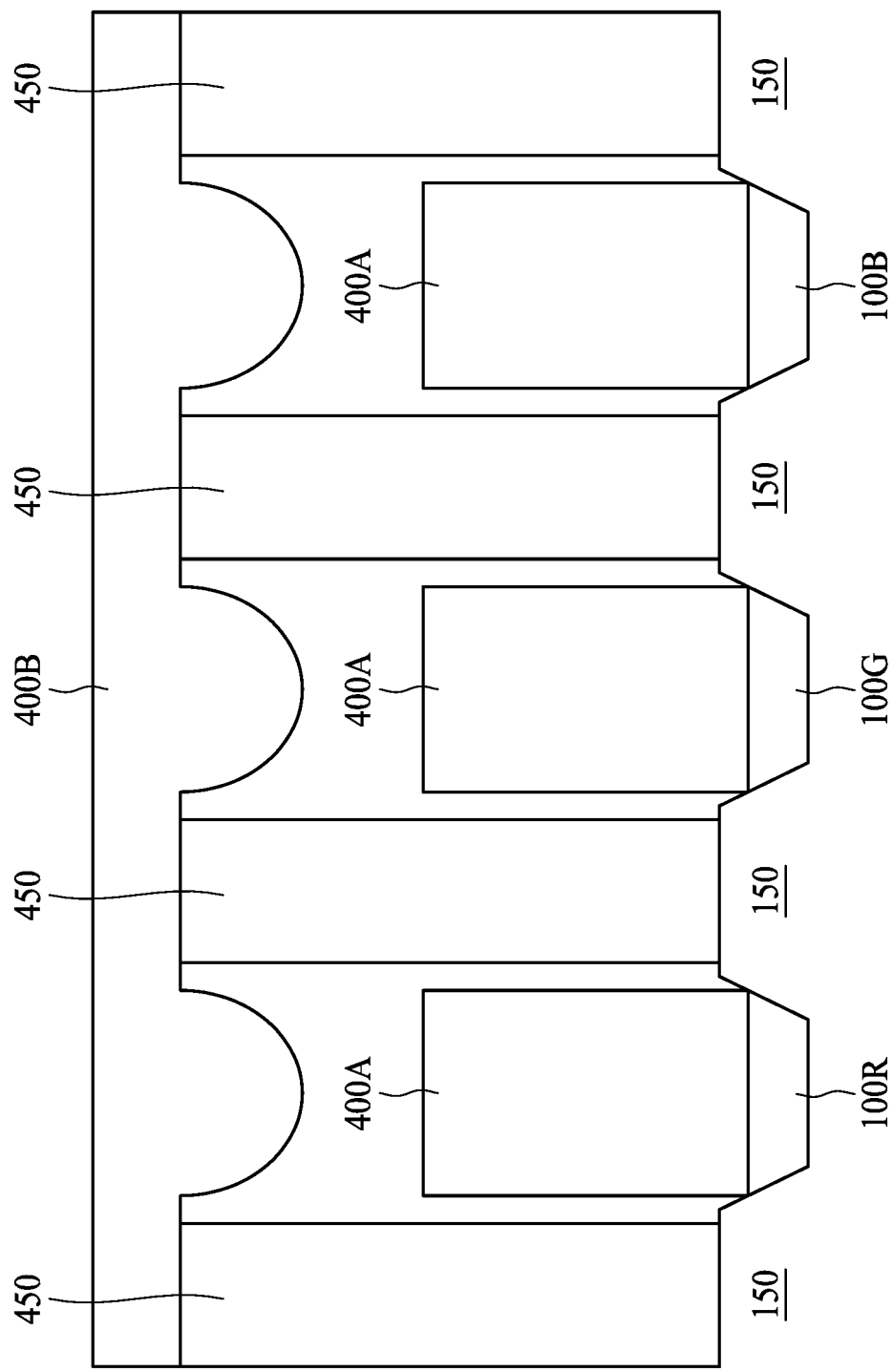
FIG. 18 is a cross sectional view illustrating another intermediate product of a light emitting device.

In some embodiments, the light emitting device 10 may include a plurality of collimating components as shown in FIG. 18. The collimating components 400 may include a first collimating component 400A and a second collimating component 400B. The first collimating component 400A and the second collimating component 400B may be disposed over the light emitting pixel 100. The first collimating component 400A and the second collimating component 400B may include same materials or different materials. In some embodiments, the first collimating component 400A may include the patterned optical film, while the second collimating component 400B may include the optical collimating lens. Consequently, the collimation of the lights emitted from the light emitting pixel 100 may be further enhanced.

Figure 19:
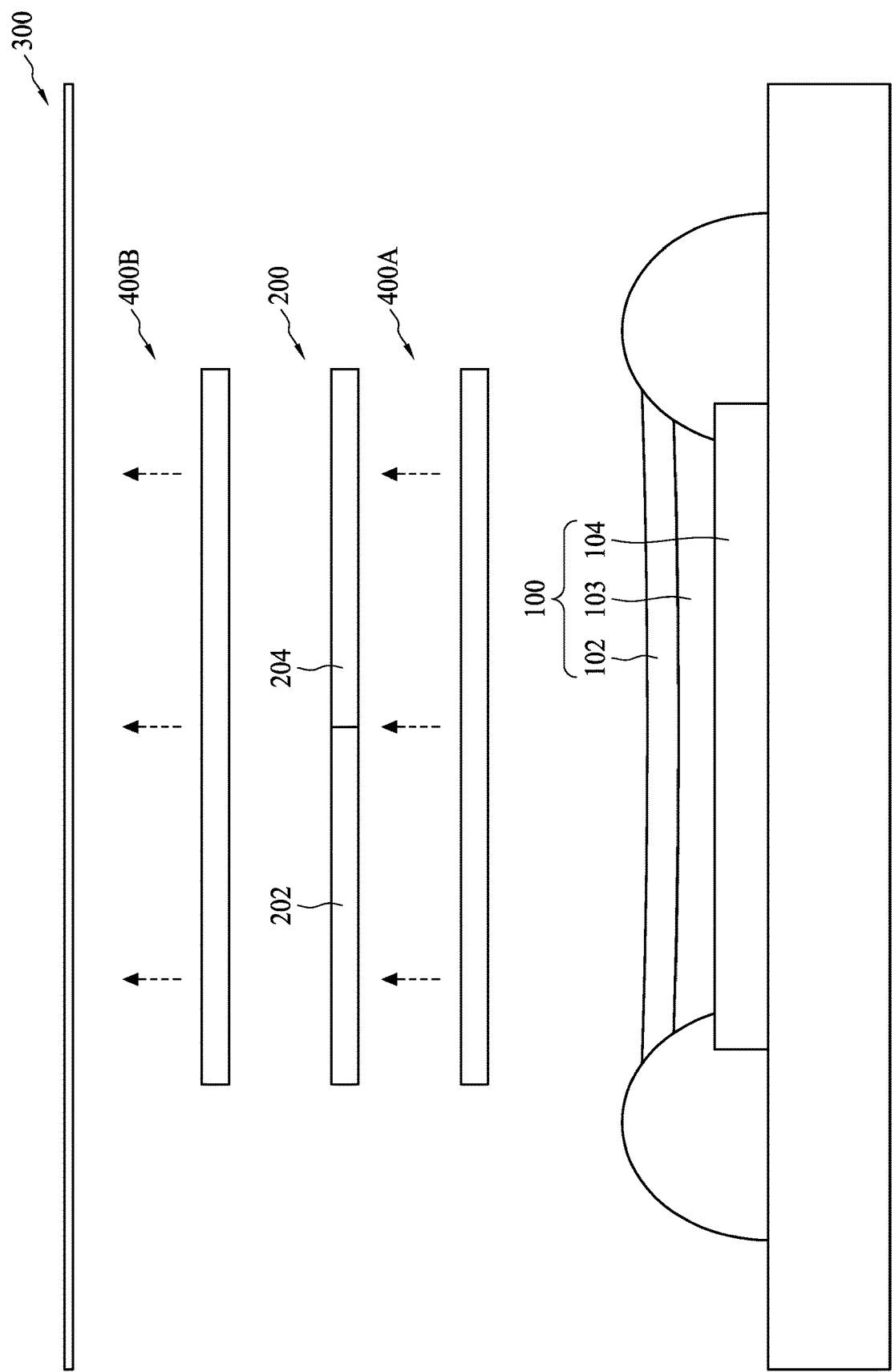
FIG. 19 is a cross sectional view illustrating another intermediate product of a light emitting device.

The arrangement of plurality of collimating components 400 may be changed due to design considerations. In some embodiments, the first collimating component 400A and the second collimating component 400B may be separated by the window 200 as shown in FIG. 19. In some embodiments, the first collimating component 400A and the second collimating component 400B may be disposed over the window 200. Alternatively, the first collimating component 400A and the second collimating component 400B may be disposed below the window 200.

Figure 20:
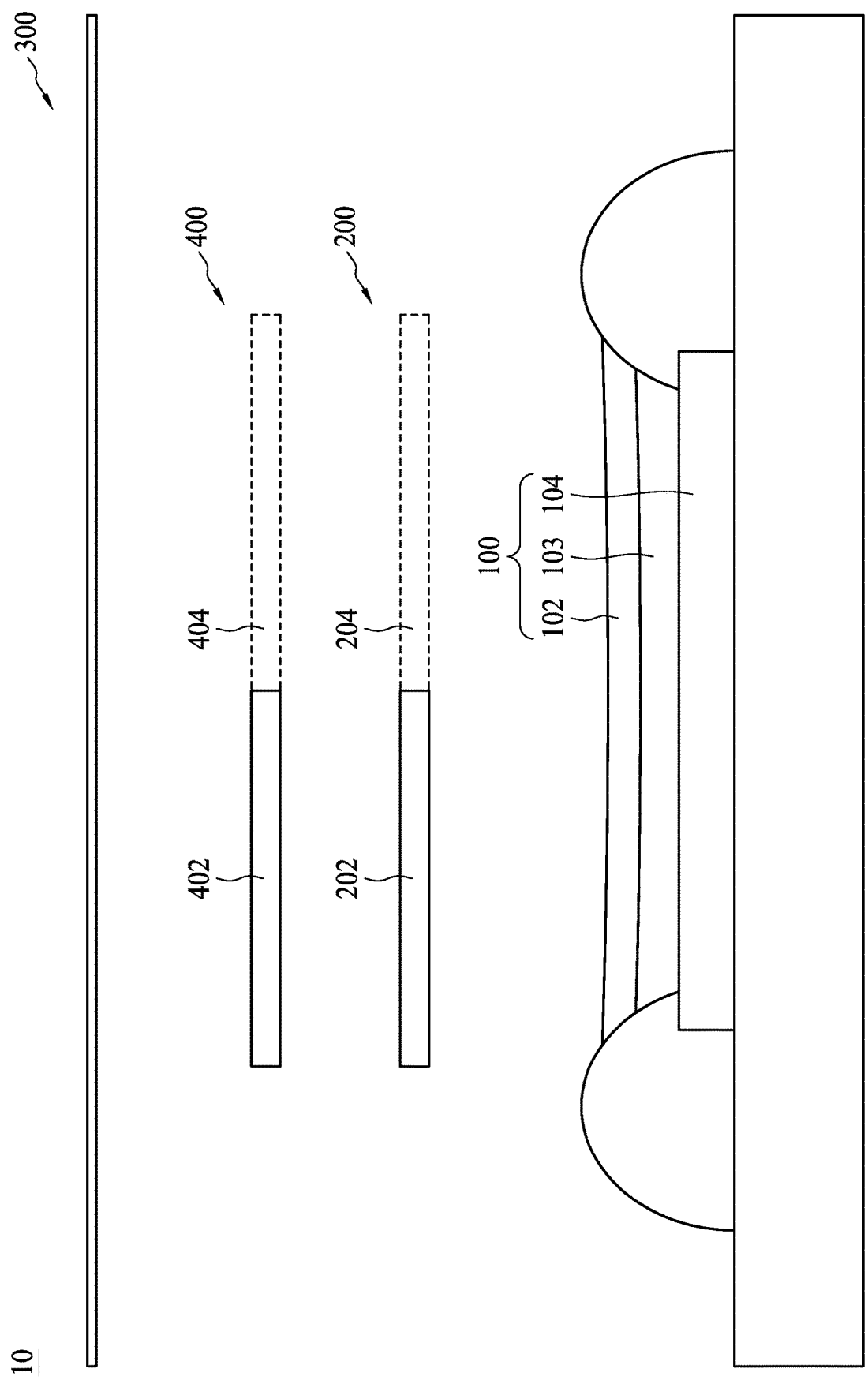
FIG. 20 is a cross sectional view illustrating another intermediate product of a light emitting device.

FIG. 20 is a cross sectional view illustrating another intermediate product of a light emitting device. The collimating component 400 may have a first area 402 and a second area 404. In some embodiments, the collimating component 400 is formed by disposing a film over the light emitting pixel 100 and then use an operation to pattern the collimating component 400 into different zones. The first area 402 and the second area 404 may include same collimating components or different collimating components. In some embodiments, the first area 402 may include the patterned optical film, while the second area 404 may include the optical fibers.

A degree of collimation to the lights from the light emitting pixel 100 between the first area 402 and the second area 404 is different. In some embodiments, the first area 402 is configured to have a higher degree of collimation to the lights from the light emitting pixel 100 than the second area 404. The refractive index of the collimating component 400 may be different in different areas. The refractive index of the collimating component 400 in the first area 402 may be greater than the refractive index of the collimating component 400 in the second area 404. The refractive index may be adjusted by choosing different materials or modifying the thickness of the collimating component 400 corresponding to different areas. In some embodiments, the focal length or the radii of curvature of the optical collimating lens may be different in different areas. Alternatively, the radius of the optical fibers may be different in different areas.

In some embodiments, the second area 404 is a blank region of the collimating component 400 as shown in FIG. 16. The second area 404 is drawn in dotted line to indicate that there is no physical material existed from a cross-sectional view. The first area 402 has a total area being smaller than the total light emitting area of the light emitting pixel 100. The light emitting pixel 100 is partially regulated by the first area 402.

In the present embodiment, the first area 402 may be vertically aligned with the first zone 202, and the second area 404 may be vertically aligned with the second zone 204, but the present disclosure is not limited thereto. In some embodiments, the second area 404 may be vertically aligned with the first zone 202, and the first area 402 may be vertically aligned with the second zone 204.

Figure 21:
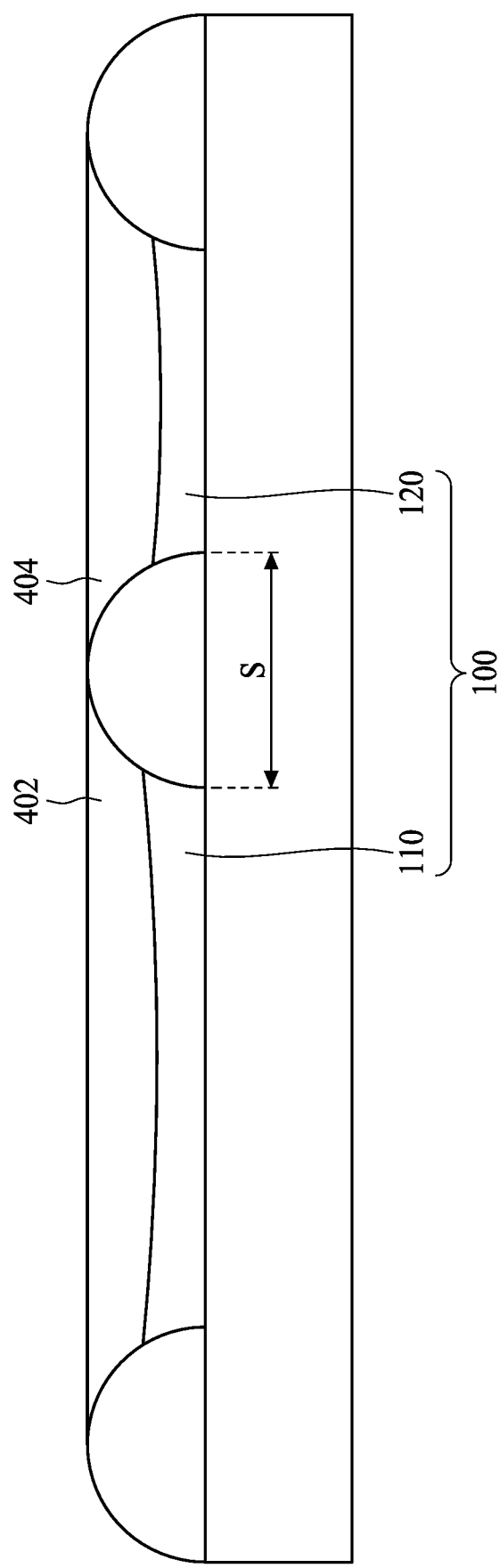
FIG. 21 is a cross sectional view illustrating another intermediate product of a light emitting device.

The light emitting pixel 100 may include a plurality of light emitting subpixels as shown in FIG. 21. The light emitting pixel 100 is a single chrome pixel. The light emitting pixel 100 has at least two subpixels 110 and 120. Subpixel 110 and subpixel 120 are respectively configured to emit a light with a same wavelength spectrum as described in FIG. 7. The collimating component 400 used in the multi-subpixel configuration is similar to the collimating component 400 used in the embodiments as illustrated in FIGS. 13-16.

In the present embodiment, the collimating component 400 may be in contact with the light emitting pixel 100 and adjacent to the window 200. The first zone 402 of the collimating component 400 may be vertically aligned with the subpixel 110, and the second zone 404 of the collimating component 400 may be vertically aligned with the subpixel 120. In some embodiments, lights emitted from the subpixel 110 have a higher degree of collimation than lights emitted from the subpixel 120. In other embodiments, the area of the subpixel 110 is greater than the area of the subpixel 120. Thus, a larger portion of collimated lights may be generated.

Figure 22:
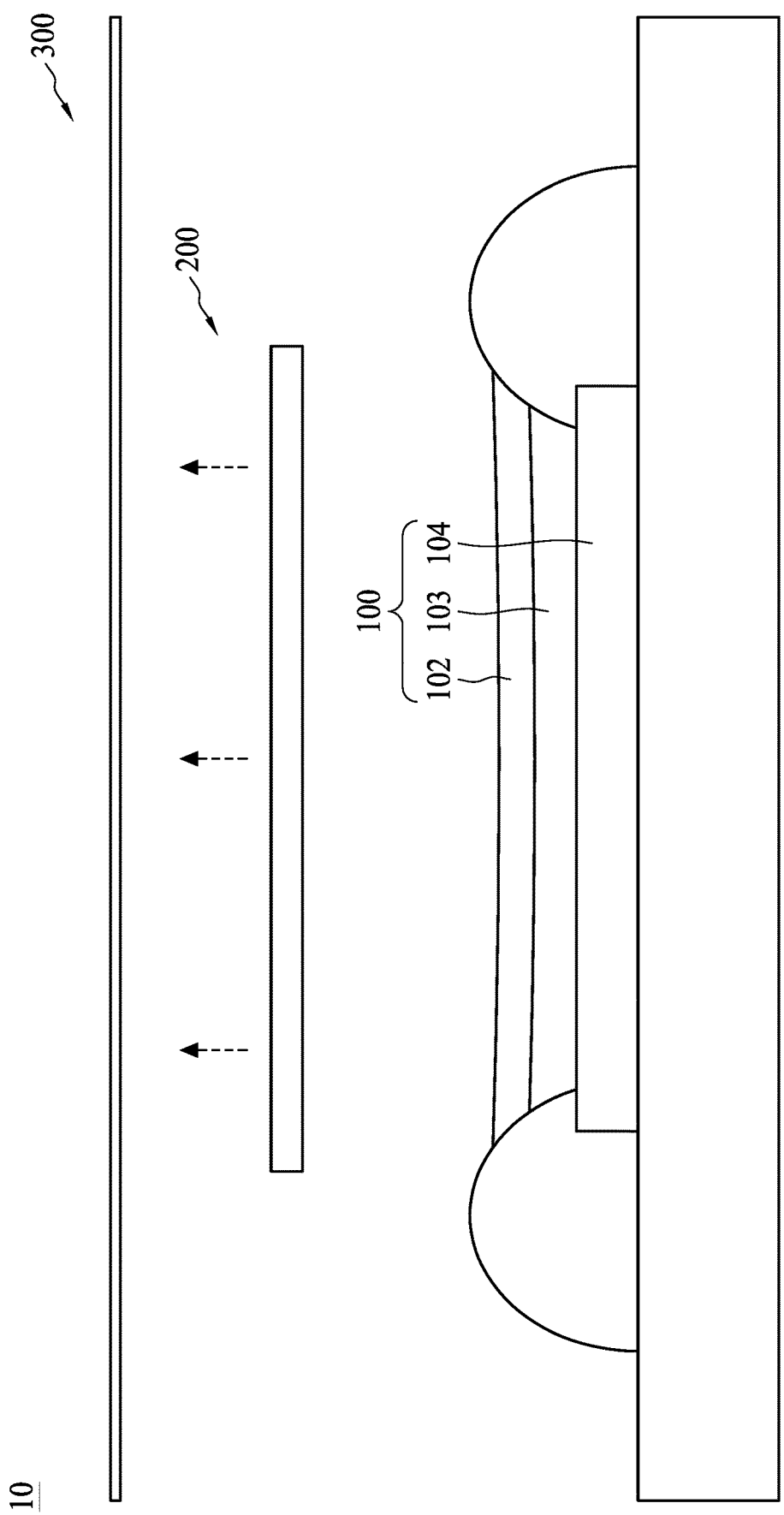
FIG. 22 is a cross sectional view illustrating another intermediate product of a light emitting device.

FIG. 22 is a cross sectional view illustrating another intermediate product of a light emitting device. As shown in FIG. 22, the optical window 200 may include the collimating component 400 as described above. The optical window 200 is over the light emitting pixel 100. The optical window 200 may include at least one of a color filter, a polarizer, a patterned optical film, an optical collimating lens, optical fibers or a combination thereof. In some embodiments, the optical window 200 may be configured to collimate the lights emitted from the light emitting pixel 100. In other embodiments, the optical window 200 may include a first zone 202 and a second zone 204 as described above (not shown in the drawings).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A light emitting device, comprising:
a window over a light emitting pixel, wherein a light reflection performance of the light emitting pixel to an incoming ambient light is configured by the window to be appeared to have at least two regions, wherein one region of the at least two regions has a smaller transmittance to the incoming ambient light than the other, the light emitting pixel includes a plurality of sub-pixels separated with a space, and the space is smaller than a resolution of a human eye; and
a collimating component over the light emitting pixel.

2. The light emitting device in claim 1, wherein the window includes a photochromic material.

3. The light emitting device in claim 1, wherein the light emitting pixel is a single chrome pixel.

4. The light emitting device in claim 1, further comprising a common electrode under the plurality of sub-pixels.

5. The light emitting device in claim 1, wherein each subpixel is in contact with an electrode segment thereunder.

6. The light emitting device in claim 5, wherein the electrode segment for each subpixel is respectively connected to a conductive plug.

7. The light emitting device in claim 1, wherein the collimating component comprises a first area and a second area, and a degree of collimation to a light from the light emitting pixel between the first area and the second area is different.

8. The light emitting device in claim 1, further comprising a black material surrounding the collimating component.

9. The light emitting device in claim 1, wherein the collimating component is over the window.

10. The light emitting device in claim 1, wherein the collimating component is under the window.

11. The light emitting device in claim 1, wherein the collimating component includes high refractive index materials compared to a reference medium.

12. The light emitting device in claim 1, wherein the collimating component includes at least one of a patterned optical film, an optical collimating lens, optical fibers or a combination thereof.

13. A light emitting device, comprising:
a light emitting array including a plurality of light emitting pixels;
an optical window over at least one of the plurality of light emitting pixels, wherein the optical window includes at least a first zone and a second zone, wherein the first zone is vertically aligned with a first region of the light emitting pixel and the second zone is vertically aligned with a second region of the light emitting pixel, wherein a transmittance to an incoming ambient light between the first zone and the second zone is different;
a collimating component over at least one of the plurality of light emitting pixel; and
an electrode between the optical window and the light emitting pixel.

14. The light emitting device in claim 13, wherein the collimating component includes at least a first area and a second area, wherein the first area is vertically aligned with the first zone and the second area is vertically aligned with the second zone.

15. The light emitting device in claim 14, wherein a refractive index of the collimating component in the first area is greater than a refractive index of the collimating component in the second area.

16. The light emitting device in claim 13, wherein the collimating component includes at least one of a patterned optical film, an optical collimating lens, optical fibers or a combination thereof.

17. The light emitting device in claim 13, wherein the collimating component partially overlaps the optical window.

* * * * *